United States Patent [19]

Val et al.

[11] Patent Number: 4,639,826
[45] Date of Patent: Jan. 27, 1987

[54] RADIATION-HARDENED CASING FOR AN ELECTRONIC COMPONENT

[75] Inventors: Christian Val, St. Remy-les Chevreuses; Joseph Pinel, Villefranche-de-Lauragais; Yves B. Gibod, St. Cyr-L'Ecole, all of France

[73] Assignee: Compagnie d'Informatique Militaire, Spatiale et Aeronautique, Paris, France

[21] Appl. No.: 613,905

[22] Filed: May 24, 1984

[30] Foreign Application Priority Data

Jun. 3, 1983 [FR] France .................. 83 09288

[51] Int. Cl.⁴ .............. H05K 5/06; B65D 73/02; H01G 1/06
[52] U.S. Cl. .................. 361/272; 174/52 FP; 206/328; 357/80
[58] Field of Search ............ 206/328; 174/52 FP; 357/80; 361/272, 321 C, 433 C

[56] References Cited

U.S. PATENT DOCUMENTS

| | | | |
|---|---|---|---|
| 3,271,625 | 9/1966 | Caracciolo | 357/80 X |
| 3,697,666 | 10/1972 | Wakley et al. | 174/52 FP |
| 4,249,196 | 2/1981 | Burroughs | 357/80 X |
| 4,323,405 | 4/1982 | China | 357/80 X |
| 4,326,095 | 4/1982 | Yamaguchi | 174/52 FP |
| 4,424,900 | 1/1984 | Petcavich | 206/328 |
| 4,451,869 | 5/1984 | Sakabe et al. | 361/321 C X |

FOREIGN PATENT DOCUMENTS 2495837 6/1982 France .

OTHER PUBLICATIONS

Manufacturing Technology Note, U.S. Army Material Development and Readiness Command, Rapport No. HDL-CR-75-216-1, December 1980 . . . .
Patents Abstracts of Japan, vol. 5, No. 103 (E-64) (775), 3 juillet 1981, & JP-A-56 45 053 (Hitachi Seisakusho K.K.) (24-04-1981).
I.B.M. Technical Disclosure Bulletin, vol. 9, No. 11 Apr. 1967, p. 11511.

Primary Examiner—Donald A. Griffin
Attorney, Agent, or Firm—Roland Plottel

[57] ABSTRACT

A casing for protecting electronic components or circuits against ionizing radiations, comprising an alternance of layers of materials having low and high atomic charge numbers, forming a multi-layer capacitor, and a base comprising an alternation of the same type.

20 Claims, 6 Drawing Figures

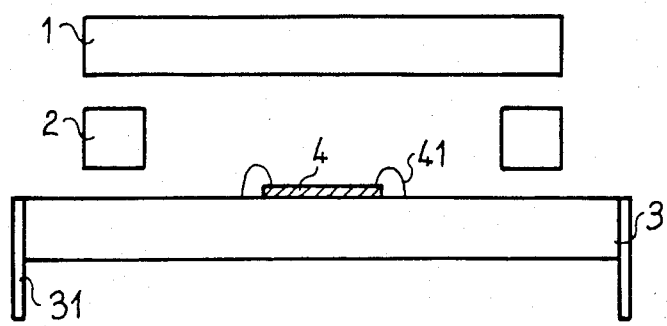
FIG_1
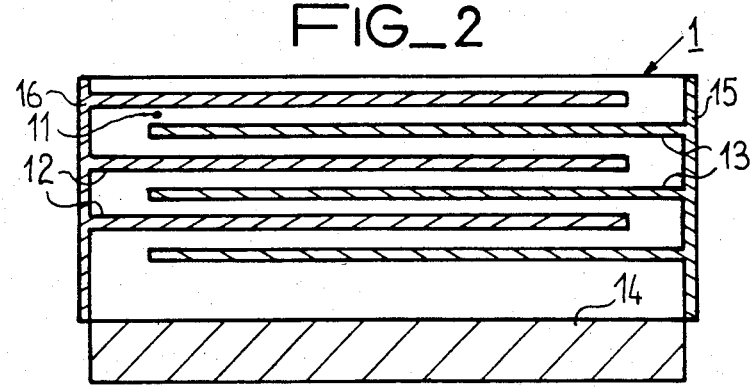
FIG_2
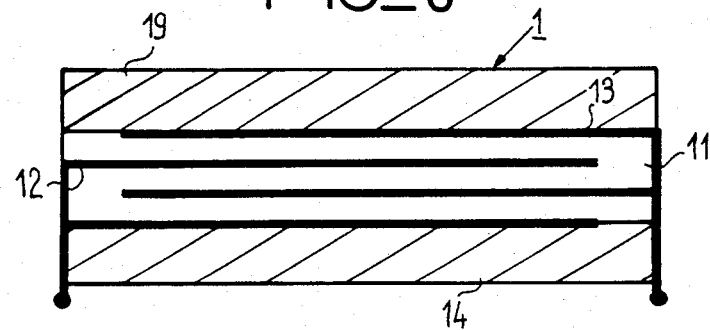
FIG_3

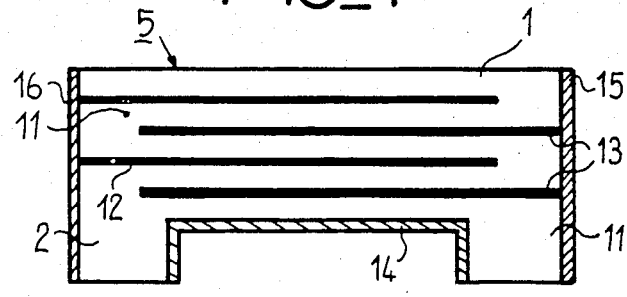
FIG_4
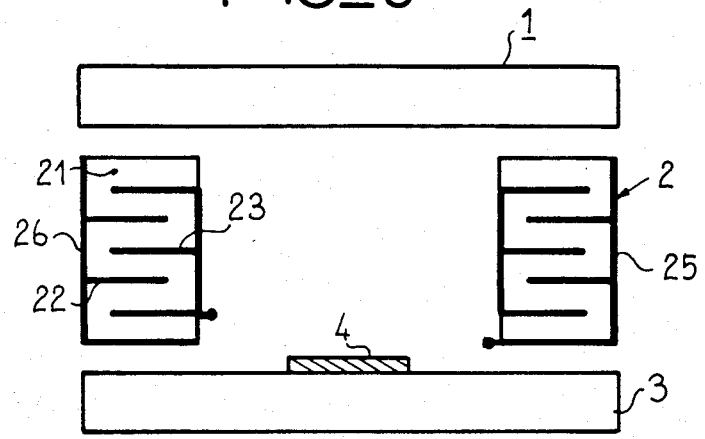
FIG_5
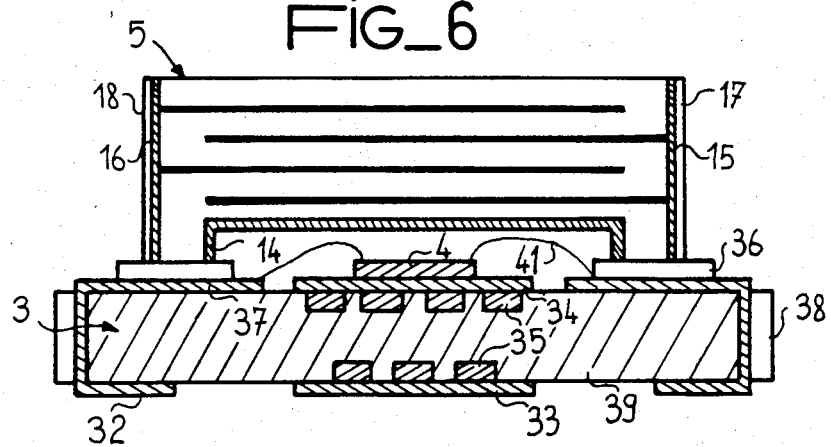
FIG_6

RADIATION-HARDENED CASING FOR AN ELECTRONIC COMPONENT

BACKGROUND OF THE INVENTION

1. Field of the Invention

The present invention relates to a casing for an electronic component, said casing being "hardened" with respect to radiations, particularly ionizing radiations, that is to say a casing which protects the component which it contains against these radiations.

In the following description, for the sake of simplicity the term "component" will designate any discrete component or assembly of components forming an hybrid circuit or an integrated circuit, capable of being embedded in a casing.

2. Description of the Prior Art

The construction of high efficiency electronic equipment not only in so far as the processing speed but also the capacity or compactness are concerned, such as embarked computers, requires complex, high speed circuits with a high degree of integration of the LSI (Large Scale Integration) or VLSI (Very Large Scale Integration) type. However, these circuits are very sensitive to the effects of radiation, more particularly to those which result from ionization.

To limit these effects, two protection or hardening techniques are usually used. The first consists in forming an outer shrouding of the complete equipment, by means for example of sheets of suitably chosen metal. Its disadvantages are principally the weight and space required, particularly troublesome for embarked equipment. According to the second technique, for constructing the equipment components and/or circuits are chosen withstanding the radiations; such components and circuits exist at the present time but only in a small number and hardening thereof is the result both of the designing rules (taking more especially into account of the parameter variations and the damage caused by the radiations) and of the chosen technologies. However, these circuits are not efficient enough for some applications, more especially with regard to the degrees of integration reached; in addition, construction thereof according to hardened technology requires sometimes extremely long times; finally, the cost thereof is very high.

SUMMARY OF THE INVENTION

An object of the present invention is to avoid these disadvantages by providing hardening at the level of the casing of the components and circuits used in the equipment to be protected.

According to the invention, there is provided a radiation-hardened casing for an electronic component, comprising three elements, namely a base for receiving the component, a side part and a cover fixed to the base by means of said side part, at least one of said elements comprising at least two layers of distinct materials, one of them being closer to the component than the other, the atomic charge number of said closer material being low with respect to that of the other.

BRIEF DESCRIPTION OF THE DRAWINGS

Other objects, features and results of the invention will be clear from the following description, illustrated by the accompanying drawings which show:

FIG. 1, the diagram of a casing for an electronic component;

FIG. 2, a first embodiment of the device according to the invention;

FIG. 3, a variant embodiment of the preceding Figure;

FIG. 4, a second embodiment of the device according to the invention;

FIG. 5, a third embodiment of the device according to the invention; and

FIG. 6, a fourth embodiment of the device according to the invention.

In these various Figures, the real scale has not been respected for the sake of clarity. Further, the same references refer to the same elements.

DESCRIPTION OF THE PREFERRED EMBODIMENTS

In FIG. 1 there is shown schematically, seen in section, a casing for a component or integrated or ybrid circuit which comprises a base 3, to which is fixed a semi-conductor chip 4 in which the component is formed, for example, and a cover 1 or fixing to base 3 by means of a side part 2.

Depending on the type of casing (DIL, Cerdip, "chip carrier", etc.., flat or including levels), the side part 2 is integral either with base 3, or with cover 1.

The component 4 is fixed to the upper face of base 3, for example by brazing to a metal layer not shown. Its connection points are connected (leads 41) to conductive tracks (not shown) which end at means for electric connection to the outside of the casing, for example pins 31.

FIG. 2 shows one embodiment of a casing in accordance with the invention, in which the hardening is achieved at the level of cover 1.

This cover comprises at least two distinct materials 11 and 12-13, each disposed in at least one layer. One of the materials has a high number of atomic charges $Z_1$ with respect to the number of charges $Z_2$ of the other material (12-13).

As is known, materials with a high number of charges highly attenuate ionizing radiations, such as X and $\gamma$ rays. However, this attenuation causes the production of an electron flow which it is also desirable to attenuate as much as possible. For that, a material with a smaller number of charges is preferable; it is sufficient from the energy point of view, lighter, thus complying with the above mentioned weight criterium, and weakly electron emissive. According to the invention, such a material is used for the internal face of the cover, that is to say the one which is situated towards the component.

In the present description by a high charge number is meant a number at least equal to 35 and by a low charge number, a number at most equal to 20.

In the embodiment shown in FIG. 2, several layers of each of the materials have been disposed so as to improve the efficiency of the device.

In addition, the materials may be chosen and the layers disposed so as to form a capacitor; the first material, 11, with high number $Z_1$, then is a dielectric and the second material, with a low number $Z_2$, is disposed in at least two layers, respectively 12 and 13, surrounding the dielectric 11, forming the plates of the capacitor. In the embodiment shown in FIG. 2, a multi layer capacitor has been formed with six plates connected together by external conductors 15 and 16. Such a capacitor may advantageously form a decoupling capacitor such as generally required for this kind of case.

Finally, it is possible, as shown in FIG. 2, to add a further layer 14 to the inner face of cover 1, said layer being made of a material whose charge number $Z_3$ is low. This variant embodiment allows greater flexibility in the choice of materials 12-13 and 11, which may then be of an averagely high charge number.

In so far as the choices of the materials is concerned, the low charge number material may be one of the following substances; carbon, aluminum, silicon, alumina and silica; the high charge number material may be a dielectric ceramic, chosen either from the titanate family for example modified barium titanate (with heavy metals) or neodyne titanate (also modified) or from the oxide family, for example titanium oxide (also modified), or a complex lead based ceramic.

By way of example, material 11 may be barium titanate ($BaTiO_3$) or a neodyne oxide; in the case where an additional layer 14 is provided, which may for example be made from alumina ($Al_2O_3$), the plates 12 and 13 may be formed from a material having a high number $Z_2$, such as silver and palladium based metals or alloys.

FIG. 3 shows a variant of the preceding Figure which comprises an additional layer 19, formed preferably from the same material as layer 14, so as to improve the technological feasibility.

In fact, it is difficult to have different materials having the same thermal expansion coefficients. If these coefficients are too different, the manufacture of the cover involving a fairly high temperature (more than a 1000°), an element is obtained which is not flat; the fact of symmetrizing the structure by means of a layer 19 having the same thermal characteristics (for example from an identical material) as layer 14 corrects this defect.

FIG. 4 shows another embodiment in which cover 1 and side part 2 are integral so as to form a cover 5, the whole of this latter being hardened.

The same varient embodiments as before may be provided for part 1 of cover 5.

The side part 2 is formed by material 11, with high number $Z_1$, coated on its inner face with layer 14, with a low number $Z_3$.

It should be noted that the side part 2 may thus be hardened independently of part 1 of the cover, which may then be hardened or not, may comprise a capacitor or not.

FIG. 5 shows another embodiment of the casing of the invention, in which the hardening is performed at the level of its side part 2.

This latter comprises, like part 1 in FIG. 2, a capacitor with its dielectric 21 and its plates 22 and 23, connected together if required (multi layer capacitor) and connected to the outside by connections 25 and 26, elements 21, 22, 23, 25 and 26 being similar to the elements 11, 12, 13, 15 and 16 of FIG. 2.

Layers 21, 22 and 23 may be formed parallel to cover 1 and to base 3, as shown in the Figure, or at 90° so as to interpose their large face between the radiation to be attenuated and component 4.

In this embodiment, cover 1 may be unhardened or hardened according to one of the preceding variants, with or without formation of a capacitor.

FIG. 6 shows another embodiment of the invention in which the base (3) of the casing is hardened.

By way of example, the casing is of the "chip carrier" type, which has the characteristic of being without connection pins, these latter being replaced by simple metalizations 32 on the lower part of base 3. Still by way of example, the base of this casing is flat.

Cover 5 is for example hardened and identical to that of FIG. 4. The connections 15 and 16 connecting the plates of the capacitor together are for example formed in semi holes 17 and 18 respectively, as is usually done for the base of a chip carrier. Cover 5 is sealed (36) to base 3.

Base 3 supports then the component 4, fixed to a metal layer 34. It is conventionally connected (leads 41) to tracks 37 disposed on base 3 and extending through semi holes 38 as far as the metalizations 32.

According to the invention, base 3 also comprises, for hardening purposes, an alternance of materials with high and low charge numbers, chosen and disposed so that they comply with the requirements usually imposed on casing bases, namely principally matching of the thermal expansion coefficient of base 3 to that of the semi conductor 4 and a good thermal conductivity for removing the power dissipated by the component. For this, base 3 is formed from a material (39) with a low charge number, alumina for example, and comprises a layer 33 of a material with a high charge number, such as tungsten, on its outer (lower) face, between the metalizations 32.

Preferably, layer 34 to which the component is fixed is also formed from a material having a low charge number.

In the varient shown in FIG. 6, there are further formed in base 3, on its two large face, inclusions 35 made from a material which is thermally a good conductor and has a high charge number. Hereagain, tungsten is suitable.

In each of the preceding embodiments, it can be advantageous to avoid a sudden transition between materials with high and low charge number. This for avoiding thermal shocks at the material interface when the radiations are intensive. Avoiding a sudden transition can be realized by means of different materials having numbers Z of charges which are intermediate. It can also be realized by means of an alloy or a composition of both involved materials.

The above description has only been given by way of non limiting example. Thus, for example, the capacitor formed in the cover may be formed from materials having a low charge number, a layer with a high charge number then being disposed on the outer face of the cover.

What is claimed is:

1. A radiation-hardened casing for an electronic component, comprising three elements, namely a base for receiving the component, a side part, and a cover fixed to the base by means of said side part, at least one of said elements comprising at least two layers of distinct materials, one of them being closer to the component than the other, the atomic charge number of said closer material being low with respect to that of the other, whereby said other layer highly attenuates ionizing radiation to provide said radiation-hardened casing and said closer layer has low electron ignition and shields said electronic component from electrons from said other layer caused by ionizing radiation.

2. The casing as claimed in claim 1, wherein said closer material has a low charge number and the other of said materials has a high charge number.

3. The casing as claimed in claim 1, wherein said element is said cover.

4. The casing as claimed in claim 3 wherein said side part is made from a material with a high charge number and comprises a layer disposed on its internal face whose charge number is low with respect to the preceding one.

5. The casing as claimed in claim 3 wherein said base is formed from a material whose charge number is low and comprises a layer, disposed on its external face, whose charge number is high with respect to the preceding one.

6. The casing as claimed in claim 5, wherein said base comprises, formed in said material with a low charge number, inclusions on its internal and external faces, said inclusions being made from a material having good thermal conductivity and a high charge number.

7. The casing as claimed in claim 1, wherein first of said materials is insulating and second of said materials is electrically conducting, said second material being disposed in at least two layers, on each side of said first material, the resulting assembly forming a capacitor.

8. The casing as claimed in claim 7, wherein said materials are each disposed in a plurality of alternate layers, thus forming a multi layer capacitor.

9. The casing as claimed in claim 7, wherein said side part is made from a material with a high charge number and comprises a layer disposed on its internal face whose charge number is low with respect to the preceding one.

10. The casing as claimed in claim 7, wherein said base is formed from a material whose charge number is low and comprises a layer, disposed on its external face, whose charge number is high with respect to the preceding one.

11. The casing as claimed in claim 10, wherein said base comprises, formed in said material with a low charge number, inclusions on its internal and external faces, said inclusions being made from a material having good thermal conductivity and a high charge number.

12. The casing as claimed in claim 1, wherein said element comprises a first further layer, disposed on its internal face, whose charge number is low.

13. The casing as claimed in claim 12, wherein said element comprises a second further layer, disposed on its external face, made from a material having the same thermal characteristics as said first further layer.

14. The casing as claimed in claim 1, wherein said element comprises a further layer, disposed on its external face, whose charge number is high.

15. The casing as claimed in claim 14, wherein said base further comprises a metal layer with low charge number, disposed on its internal face, said component being fixed to said metal layer.

16. The casing as claimed in claim 1, wherein the transition between materials with differents charge numbers is realized by means of intermediate materials.

17. The casing as claimed in claim 1, wherein said material with a low charge number has a number of charges at most equal to twenty.

18. The casing as claimed in claim 1, wherein the material with low charge number is chosen from the following group: carbon, aluminum, silicon, alumina, silica.

19. The casing as claimed in claim 1, wherein said material with a high charge number has a number of charges at least equal to 35.

20. The casing as claimed in claim 1, wherein said material with a high charge number is a dielectric ceramic chosen from the titanate family, from the oxide family or from the family of complex lead based ceramics.

* * * * *